(12) United States Patent
Kitagawa

(10) Patent No.: US 11,121,009 B2
(45) Date of Patent: Sep. 14, 2021

(54) POWER FEEDING MECHANISM AND METHOD FOR CONTROLLING TEMPERATURE OF A STAGE

(71) Applicant: Tokyo Electron Limited, Tokyo (JP)

(72) Inventor: Dai Kitagawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 262 days.

(21) Appl. No.: 15/300,342

(22) PCT Filed: Apr. 30, 2015

(86) PCT No.: PCT/JP2015/062961
§ 371 (c)(1),
(2) Date: Sep. 29, 2016

(87) PCT Pub. No.: WO2015/174287
PCT Pub. Date: Nov. 19, 2015

(65) Prior Publication Data
US 2017/0140957 A1    May 18, 2017

(30) Foreign Application Priority Data
May 12, 2014 (JP) .............................. JP2014-098569

(51) Int. Cl.
*H01L 21/67* (2006.01)
*H01J 37/32* (2006.01)
*H01L 21/683* (2006.01)

(52) U.S. Cl.
CPC .. *H01L 21/67103* (2013.01); *H01J 37/32009* (2013.01); *H01J 37/32431* (2013.01);
(Continued)

(58) Field of Classification Search
CPC ........... H01L 21/67103; H01L 21/6831; H01L 21/67069; H01L 21/67248;
(Continued)

(56) References Cited

U.S. PATENT DOCUMENTS 3,752,956 A * 8/1973 Cahill ................ G05D 23/2401
219/505
4,316,078 A * 2/1982 Mack ...................... F24C 7/087
219/386
(Continued)

FOREIGN PATENT DOCUMENTS

CN    101828870    9/2010
CN    102856242    1/2013
(Continued)

*Primary Examiner* — Eric S Stapleton
(74) *Attorney, Agent, or Firm* — IPUSA, PLLC

(57) ABSTRACT

A heater power feeding mechanism is provided that divides a stage on which a substrate is placed into zones by using a plurality of heaters and can control a temperature of each of the zones. The heater power feeding mechanism includes a plurality of sets of heater terminals connected to any of the plurality of heaters by a segment unit when a set of the heater terminals is made one segment, a heater interconnection, and an interconnection structure configured to connect at least any of the plurality sets of the heater terminals with each other by using the heater interconnection by the segment unit.

2 Claims, 9 Drawing Sheets

(52) U.S. Cl.
CPC .. *H01J 37/32724* (2013.01); *H01L 21/67069* (2013.01); *H01L 21/67248* (2013.01); *H01L 21/6831* (2013.01); H01J 2237/334 (2013.01)

(58) Field of Classification Search
CPC ........... H01J 37/32009; H01J 37/32431; H01J 2237/334; H01J 37/32724
USPC .................................................. 219/447, 477
See application file for complete search history.

(56) References Cited

U.S. PATENT DOCUMENTS

| | | | | |
|---|---|---|---|---|
| 4,375,950 A * | 3/1983 | Durley, III | ............... | F23N 1/022 236/15 BD |
| 4,908,226 A * | 3/1990 | Kubena | ................. | C23C 16/047 427/526 |
| 5,023,430 A * | 6/1991 | Brekkestran | ........ | A41D 13/0051 2/69 |
| 5,103,102 A * | 4/1992 | Economou | ............... | H01J 37/18 118/722 |
| 5,184,398 A * | 2/1993 | Moslehi | ................. | C23C 16/4583 257/E21.531 |
| 5,236,747 A * | 8/1993 | Dessaux | .............. | C23C 16/0245 427/535 |
| 5,280,434 A * | 1/1994 | Ekendahl | ............... | B29C 51/422 340/588 |
| 5,414,519 A * | 5/1995 | Han | ....................... | H01L 21/681 356/401 |
| 5,483,490 A * | 1/1996 | Iwai | ........................ | G11C 29/83 365/200 |
| 5,660,047 A * | 8/1997 | Paganessi | .......... | H01L 21/67103 62/64 |
| 5,683,928 A * | 11/1997 | Wojnarowski | ......... | H01C 17/12 148/DIG. 136 |
| 5,713,441 A * | 2/1998 | Chen | .................... | A45C 13/262 16/113.1 |
| 5,802,856 A * | 9/1998 | Schaper | .................... | B01L 7/52 118/724 |
| 5,872,040 A * | 2/1999 | Wojnarowski | ......... | H01C 17/12 438/393 |
| 5,968,379 A * | 10/1999 | Zhao | ................. | C23C 16/45565 118/723 I |
| 6,023,052 A * | 2/2000 | Carl, Jr. | .............. | G05D 23/1913 219/483 |
| 6,040,226 A * | 3/2000 | Wojnarowski | .......... | H01L 21/20 336/137 |
| 6,063,710 A * | 5/2000 | Kadomura | ........ | H01L 21/32137 257/E21.312 |
| 6,093,654 A * | 7/2000 | Koyama | ................ | C23C 14/022 257/E21.169 |
| 6,245,147 B1 * | 6/2001 | Kobayashi | ........ | H01L 21/67103 118/500 |
| 6,392,205 B1 * | 5/2002 | Minonishi | ......... | H01L 21/67103 219/443.1 |
| 6,427,324 B1 * | 8/2002 | Franklin | ................ | H01L 21/485 29/852 |
| 6,455,821 B1 * | 9/2002 | Stumbo | ............... | G03F 7/70875 219/483 |
| 6,469,283 B1 * | 10/2002 | Burkhart | ........... | H01L 21/67248 219/486 |
| 6,512,207 B1 * | 1/2003 | Dress | ................. | H01L 21/67103 118/724 |
| 6,753,253 B1 * | 6/2004 | Takahashi | ............ | H01J 37/304 257/E21.295 |
| 6,825,448 B2 * | 11/2004 | Gianoulakis | ...... | H01L 21/67103 219/443.1 |
| 6,866,092 B1 * | 3/2005 | Molivadas | ................. | F01L 3/12 123/41.2 |
| 7,045,014 B2 * | 5/2006 | Mahon | .......... | H01J 37/32559 118/500 |
| 7,196,295 B2 * | 3/2007 | Fennewald | ......... | B29C 45/2737 219/212 |
| 7,521,367 B2 * | 4/2009 | Crawford | .......... | H01L 21/76892 438/438 |
| 7,666,690 B2 * | 2/2010 | Lee | ....................... | H01L 21/485 438/4 |
| 7,795,154 B2 * | 9/2010 | Tanaka | ............... | B23K 26/0732 438/738 |
| 7,830,002 B2 * | 11/2010 | Cok | .................... | H01L 27/3276 257/723 |
| 8,380,360 B2 * | 2/2013 | Yamaguchi | ............. | C23C 16/46 110/190 |
| 8,846,445 B2 * | 9/2014 | Trezza | ................. | H01L 23/427 438/107 |
| 9,021,984 B2 * | 5/2015 | Yamamoto | ........ | H01J 37/32091 118/723 E |
| 9,123,755 B2 * | 9/2015 | Swanson | ........... | H01L 21/67103 |
| 9,337,067 B2 * | 5/2016 | Roy | ................... | H01L 21/67109 |
| 9,691,644 B2 * | 6/2017 | Kong | ................... | C23C 18/1879 |
| 2001/0001184 A1 * | 5/2001 | Dommann | ............ | B08B 7/0035 156/273.1 |
| 2003/0051665 A1 * | 3/2003 | Zhao | ................. | C23C 16/45565 118/723 E |
| 2003/0064225 A1 * | 4/2003 | Ohashi | .................... | C23C 16/27 428/408 |
| 2003/0066826 A1 * | 4/2003 | Lee | .................... | H01L 21/67103 219/444.1 |
| 2003/0085206 A1 * | 5/2003 | Kosakai | ............ | H01J 37/32009 219/121.52 |
| 2003/0164226 A1 * | 9/2003 | Kanno | .............. | H01L 21/67109 156/345.51 |
| 2003/0186183 A1 * | 10/2003 | Ito | ..................... | H01L 21/67103 432/253 |
| 2004/0112885 A1 * | 6/2004 | Shigeoka | .......... | H01L 21/67115 219/388 |
| 2004/0175549 A1 * | 9/2004 | Ito | .......................... | B32B 18/00 428/209 |
| 2004/0177927 A1 * | 9/2004 | Kikuchi | ............ | H01J 37/32174 156/345.51 |
| 2004/0217104 A1 * | 11/2004 | Gianoulakis | ...... | H01L 21/67103 219/443.1 |
| 2004/0226514 A1 * | 11/2004 | Mahon | .............. | H01J 37/32559 118/728 |
| 2004/0232136 A1 * | 11/2004 | Hisaii | ............... | H01L 21/67103 219/444.1 |
| 2004/0238522 A1 * | 12/2004 | Edwards | ............. | B25B 11/005 219/444.1 |
| 2005/0145617 A1 * | 7/2005 | McMillin | .................. | H05B 3/28 219/543 |
| 2006/0058910 A1 * | 3/2006 | McBain | .............. | B29C 45/1679 700/197 |
| 2006/0075799 A1 * | 4/2006 | Schroth | .................. | B21D 37/16 72/342.8 |
| 2006/0113693 A1 * | 6/2006 | McBain | .................. | B29C 37/0028 264/40.1 |
| 2006/0144516 A1 * | 7/2006 | Ricci | ................. | H01L 21/67103 156/345.27 |
| 2006/0168839 A1 * | 8/2006 | Lee | .................... | H01L 21/67109 34/92 |
| 2006/0191482 A1 * | 8/2006 | Kanno | .............. | H01J 37/32935 118/725 |
| 2006/0289447 A1 * | 12/2006 | Mohamed | .......... | H01L 21/67103 219/444.1 |
| 2007/0269976 A1 * | 11/2007 | Futase | ............... | H01L 21/02063 438/637 |
| 2008/0011737 A1 * | 1/2008 | Fukuoka | ........... | H01L 21/67103 219/444.1 |
| 2008/0083403 A1 * | 4/2008 | King | ................... | F24D 19/1009 126/344 |
| 2008/0102412 A1 * | 5/2008 | Weichert | ........... | H01L 21/67109 432/1 |
| 2008/0190364 A1 * | 8/2008 | Mahon | ................ | H01L 21/6831 118/500 |
| 2008/0236614 A1 * | 10/2008 | Yakushiji | ......... | H01L 21/3065 134/1.1 |
| 2008/0237184 A1 * | 10/2008 | Yakushiji | .......... | H01J 37/32431 216/67 |

(56) References Cited

U.S. PATENT DOCUMENTS

| | | | | |
|---|---|---|---|---|
| 2009/0059461 | A1* | 3/2009 | Yonekura | H01L 21/67103 361/234 |
| 2009/0105867 | A1* | 4/2009 | Yamaguchi | C23C 16/46 700/121 |
| 2009/0159588 | A1* | 6/2009 | Morioka | H01L 21/67103 219/444.1 |
| 2009/0236315 | A1* | 9/2009 | Willwerth | H01J 37/32522 216/67 |
| 2009/0262339 | A1* | 10/2009 | Suga | G01N 21/9501 356/237.3 |
| 2010/0052162 | A1* | 3/2010 | Iijima | H01L 24/11 257/737 |
| 2010/0062182 | A1* | 3/2010 | Arai | G02F 1/1309 427/569 |
| 2010/0206865 | A1* | 8/2010 | Jaccard | A47J 31/44 219/438 |
| 2011/0000426 | A1* | 1/2011 | Herchen | H01L 21/67103 118/50 |
| 2011/0075118 | A1* | 3/2011 | Jacobs | G03B 27/52 355/30 |
| 2011/0092072 | A1* | 4/2011 | Singh | C23C 14/541 438/710 |
| 2011/0125443 | A1* | 5/2011 | Merkl | G01J 5/0003 702/99 |
| 2011/0232878 | A1* | 9/2011 | Jacobs | F28D 15/04 165/104.26 |
| 2011/0240221 | A1* | 10/2011 | Yamamoto | H01J 37/32091 156/345.28 |
| 2011/0297321 | A1* | 12/2011 | Matsuda | C23C 16/4586 156/345.51 |
| 2012/0021132 | A1* | 1/2012 | Shimizu | C23C 14/083 427/453 |
| 2012/0270169 | A1* | 10/2012 | Yamaga | H01L 21/67248 432/49 |
| 2012/0285658 | A1* | 11/2012 | Roy | H01L 21/67109 165/47 |
| 2013/0001213 | A1* | 1/2013 | Lee | H01L 21/67103 219/385 |
| 2013/0105465 | A1* | 5/2013 | Swanson | H05B 3/20 219/508 |
| 2013/0306871 | A1* | 11/2013 | Cibere | H01L 21/67115 250/340 |
| 2013/0337655 | A1* | 12/2013 | Lee | H01J 37/32844 438/715 |
| 2014/0014643 | A1* | 1/2014 | Akiba | H01L 21/67103 219/444.1 |
| 2014/0014644 | A1* | 1/2014 | Akiba | H01L 21/67103 219/444.1 |
| 2014/0091077 | A1* | 4/2014 | Kong | C23C 18/1879 219/444.1 |
| 2014/0295667 | A1* | 10/2014 | Kaga | C23C 16/34 438/680 |
| 2015/0128098 | A1* | 5/2015 | Chang | G06F 17/5081 716/52 |
| 2015/0228548 | A1* | 8/2015 | Adderly | H01L 22/12 438/4 |

FOREIGN PATENT DOCUMENTS

| | | |
|---|---|---|
| JP | 2003-051433 | 2/2003 |
| JP | 2006-279008 | 10/2006 |
| JP | 2011-091361 | 5/2011 |
| JP | 2012-089653 | 5/2012 |
| JP | 2013-016806 | 1/2013 |

* cited by examiner

FIG.5A
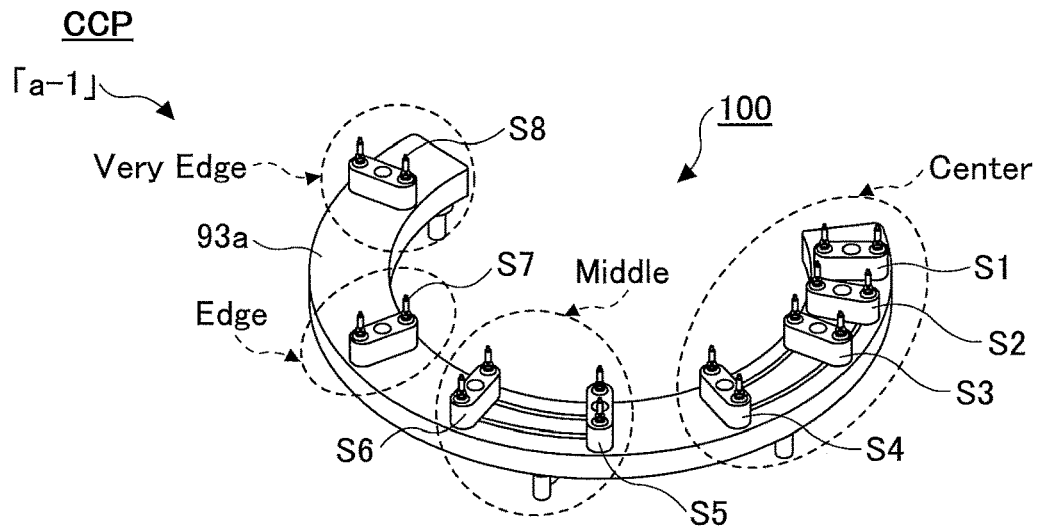
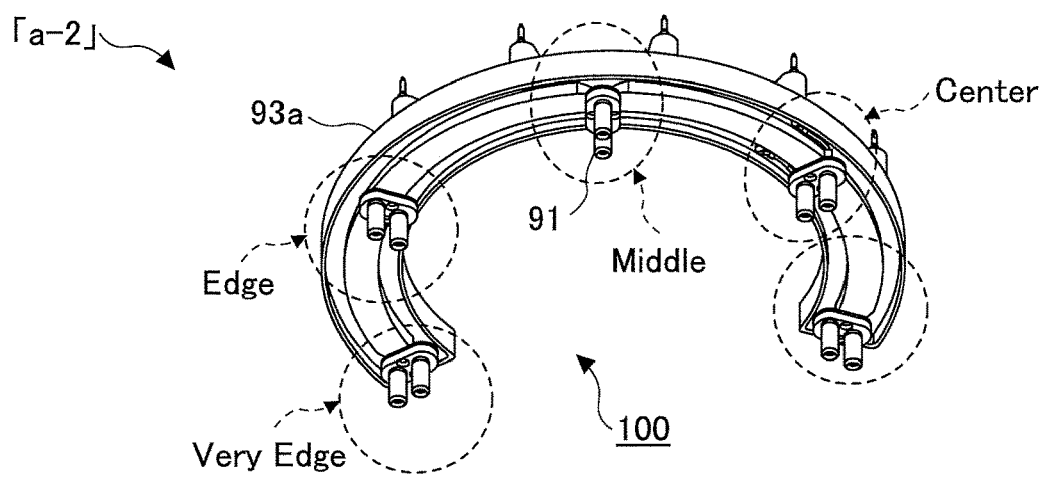
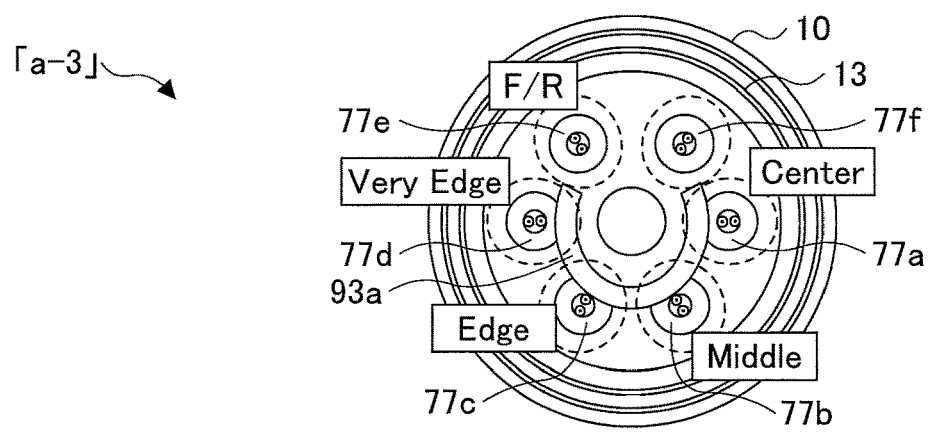

FIG.5B
RADIAL LINE SLOT ANTENNA
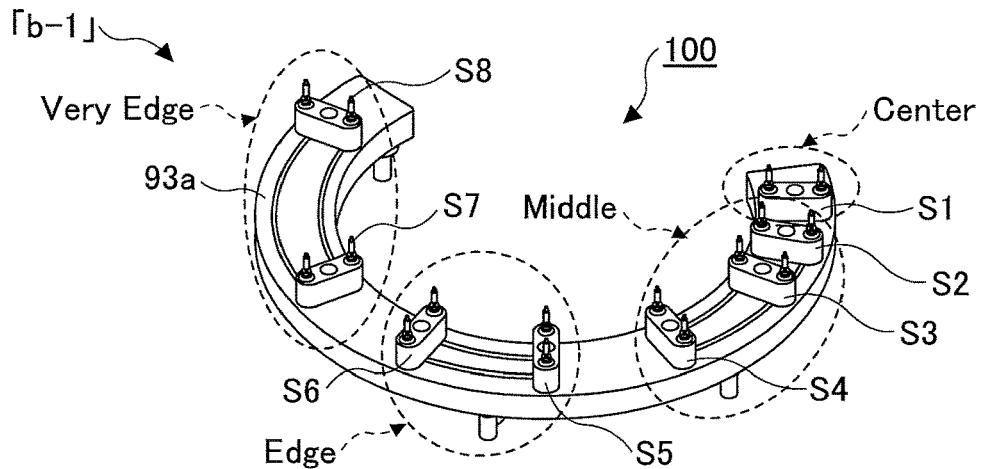
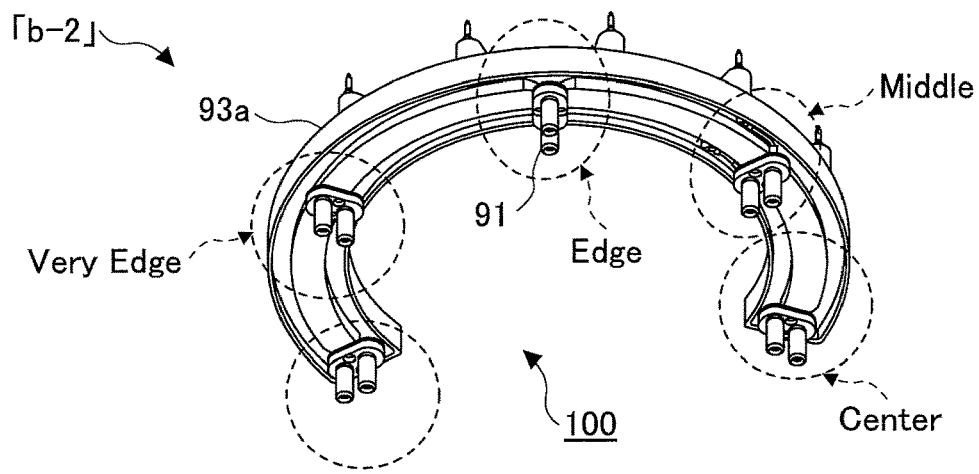
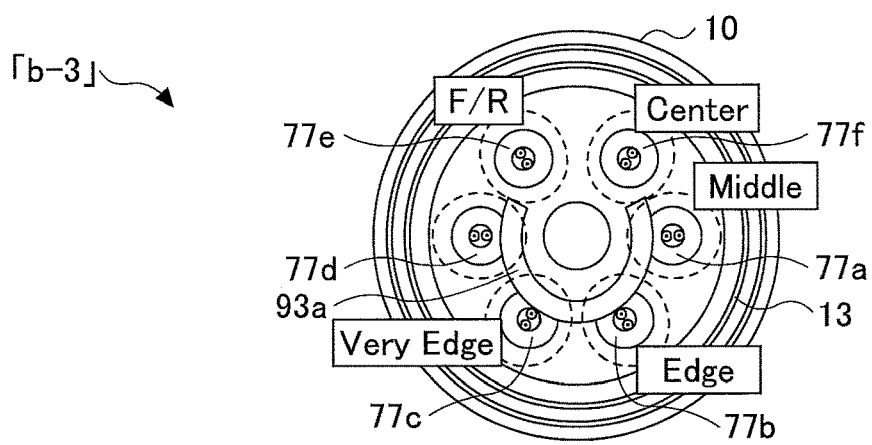

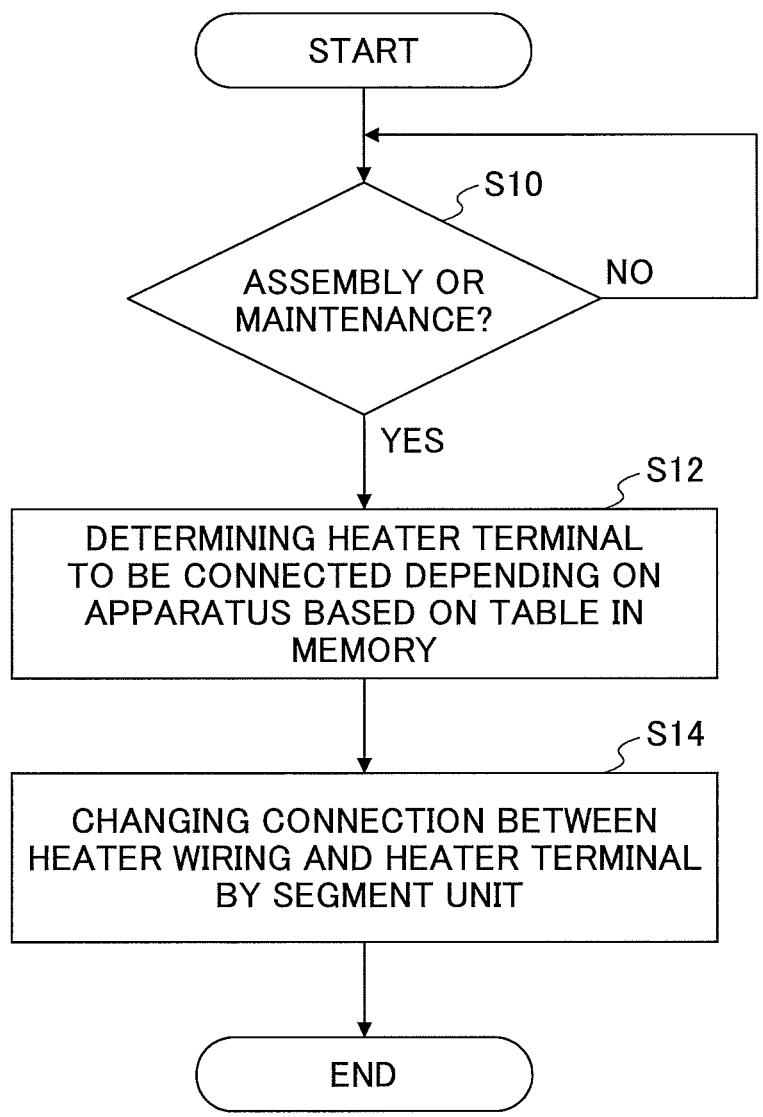

FIG.7

| APPARATUS | HEATER TERMINAL (SEGMENT UNIT) | | | |
|---|---|---|---|---|
| | Center | Middle | Edge | Very Edge |
| CCP | S1~S4 | S5,S6 | S7 | S8 |
| RADIAL LINE SLOT ANTENNA | S1 | S2~S4 | S5,S6 | S7,S8 |
| ICP | S1~S3 | S4,S5 | S6,S7 | S8 |

POWER FEEDING MECHANISM AND METHOD FOR CONTROLLING TEMPERATURE OF A STAGE

TECHNICAL FIELD

The present invention relates to a power feeding mechanism and a method for controlling temperature of a stage.

BACKGROUND ART

In semiconductor manufacturing apparatuses that finely process a semiconductor wafer (which is referred to as a "wafer" hereinafter) by an etching and the like, a temperature of a stage on which a wafer is placed has an impact on an effect of the process such as an etching rate. Therefore, embedding a heater in the stage and controlling a temperature of the stage by heating the heater are proposed. For example, Patent Document 1 discloses a device for controlling a temperature of an electrostatic chuck by equalizing an amount of heat generation of the electrostatic chuck by using external resistance in order to remedy the unevenness of surface temperature associated with unitization of the electrostatic chuck.

Moreover, in the temperature control of the electrostatic chuck, embedding a plurality of heaters inside the electrostatic chuck is proposed. In this case, by dividing the stage into zones for each heater and performing "multi-zone control" in which the temperature of the stage is controlled for each zone, the uniformity of the wafer temperature across the surface of the wafer on the stage can be improved.

PRIOR ART DOCUMENTS

Patent Documents

Patent Document 1: Japanese Laid-Open Patent Application Publication No. 2003-51433

SUMMARY OF THE INVENTION

Problem to be Solved by the Invention

In the meantime, distribution of the generated plasma varies depending on the properties of a plasma processing apparatus, process conditions or the like. Accordingly, the zone configuration is preferred to be variably controlled depending on the distribution of plasma in order to enhance the uniformity across the surface of the stage.

For example, when the distribution of plasma is likely to be uniform inside the stage and is likely to be non-uniform outside the stage, the uniformity across the surface of the stage can be enhanced by controlling the zone configuration (i.e., arrangement of each of the zones) so that the inside zone becomes wide and the outside zone becomes narrow. In contrast, when the distribution of plasma is likely to be uniform outside the stage, and is likely to be non-uniform inside the stage, it is preferable to change the zone configuration so that the outside zone becomes wide and the inside zone becomes narrow.

However, in order to change the zone configuration, the arrangement of the plurality of heaters embedded in the electrostatic chuck needs to be changed. Moreover, to change the arrangement of the plurality of heaters, a ceramic sintered body containing the plurality of heaters formed at positions depending on a desired zone configuration needs to be newly produced.

In response to the above issue, according to an aspect, it is intended to variably control the zone configuration in controlling a temperature of a stage for each zone.

Means for Solving the Problem

To solve the above issue, according to an embodiment of the present invention, there is provided a heater power feeding mechanism configured to divide a stage on which a substrate is placed into zones by using a plurality of heaters and to be able to control a temperature of each of the zones. The heater power feeding mechanism includes a plurality of sets of heater terminals connected to any of the plurality of heaters by a segment unit when a set of the heater terminals is made one segment, a heater interconnection, and an interconnection structure configured to connect at least any of the plurality sets of the heater terminals with each other by using the heater interconnection by the segment unit.

Advantageous Effect of the Invention

According to an embodiment of the present invention, a zone configuration in controlling a temperature of a stage for each zone can be variably controlled.

BRIEF DESCRIPTION OF THE DRAWINGS

FIG. 5A is a diagram illustrating an example of a zone configuration according to an embodiment (in the case of a CCP);

FIG. 5B is a diagram illustrating an example of a zone configuration according to an embodiment (in the case of a radial line slot antenna);

FIG. 6 is a flowchart illustrating an example of a method for controlling temperature of a stage according to an embodiment; and FIG. 7 is a table illustrating an example of a zone configuration for each apparatus according to an embodiment.

EMBODIMENTS FOR IMPLEMENTING THE INVENTION

Figure 1:
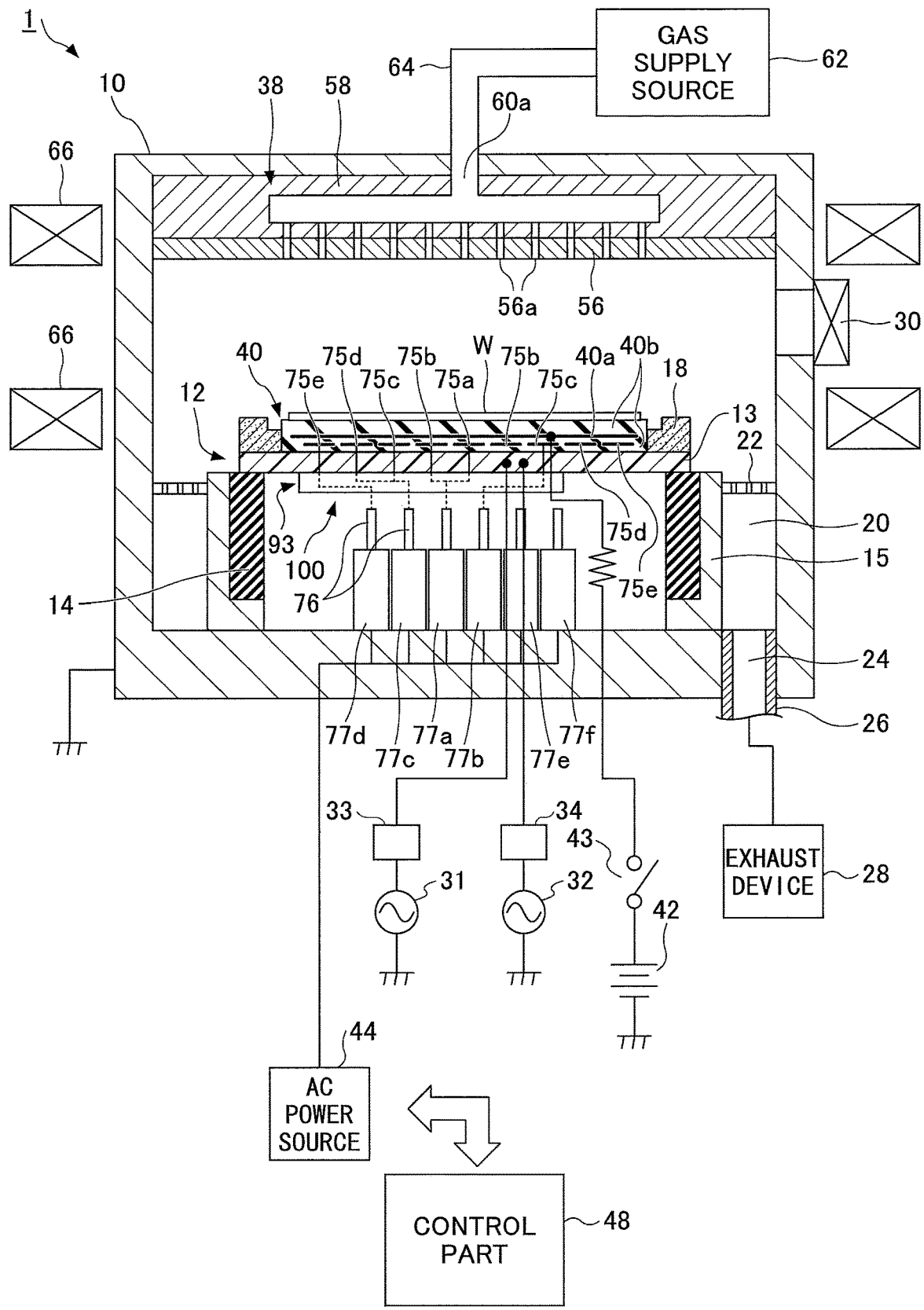
FIG. 1 is a longitudinal cross-sectional view of an etching apparatus according to an embodiment.

In the following, embodiments of the present invention are described with reference to the accompanying drawings. Note that elements having substantially the same functions or features may be given the same reference numerals and overlapping descriptions thereof may be omitted.

[Overall Configuration of Plasma Processing Apparatus]

To begin with, an overall configuration of a plasma processing apparatus 1 according to an embodiment of the present invention is described below with reference to FIG. 1. FIG. 1 illustrates a longitudinal cross section of the plasma processing apparatus according to the embodiment of the present invention. In the present embodiment, a capacitively coupled type plasma etching apparatus is cited as an example of the plasma processing apparatus 1. The plasma processing apparatus 1 includes a cylindrical chamber (process container) 10 made of, for example, aluminum whose surface is alumited (anodized). The chamber 10 is grounded, and a plasma process such as an etching is performed on a wafer W inside a process chamber.

A stage 12 on which the wafer W is to be placed is provided in the chamber 10. The stage 12 includes an electrostatic chuck 40 and a holding plate 13 that holds the electrostatic chuck 40. The holding plate 13 is made of an insulating member such as resin. An interconnection structure 93 such as a heater interconnection is provided on a lower surface of the holding plate 13. The holding plate 13 is supported by a support 15 via an insulating holding part 14. Thus, the stage is fixed to the inside of the chamber 10.

The electrostatic chuck 40 to hold a wafer W thereon by an electrostatic attracting force is provided on a top surface of the stage 12. The electrostatic chuck 40 is famed by sandwiching an electrode 40a made of a conductive film between a pair of insulting layers 40b (or insulating sheets), and a direct-current voltage source 42 is connected to the electrode 40a through a switch 43. The electrostatic chuck 40 attracts and holds the wafer W on the electrostatic chuck by Coulomb's force by a voltage from the direct-current voltage source 42. A focus ring 18 made of, for example, silicon or quartz, is disposed in a periphery of the electrostatic chuck 40 to improve uniformity of the etching across a surface of the wafer W.

A first high frequency power source 31 for plasma excitation is connected to the stage 12 through a matching box 33, and a second high frequency power source 32 for attracting ions toward the wafer W is connected to the stage 12 through a matching box 34. For example, the first high frequency power source 31 supplies first high frequency power with a frequency of, for example, 60 MHz to the stage 12, which is preferable to generate plasma in the chamber 10. The second high frequency power source 32 supplies second high frequency power with a relatively low frequency of, for example, 0.8 MHz to the stage 12, which is preferable to attract ions in the plasma toward the wafer W on the stage 12. Thus, the stage 12 receives the wafer W thereon and has a function of a lower electrode.

Heaters 75a, 75b, 75c, 75d and 75e (which are also collectively referred to as "heaters 75") are embedded in the electrostatic chuck 40. The heaters 75 may be attached to the back surface of the electrostatic chuck 40 instead of being embedded in the electrostatic chuck 40. The number of the heaters 75 may be any number as long as the number is plural.

The heaters 75 are connected to power-feeding-part cover structures 76 through interconnections of the interconnection structure 93 to the power-feeding-part cover structures 76. The power-feeding-part power structures 76 are connected to heater filters 77a, 77b, 77c, 77d, 77e and 77f (which are also collectively referred to as "heater filters 77" hereinafter). The heater filters 77 are, for example, formed of coils, and protect an AC power source 44 by removing high frequency power supplied from the first high frequency power source 31 and the second high frequency power source 32.

The power-feeding-part cover structures 76 and the heater filters 77 are arranged at positions illustrated in FIG. 1 for the purpose of illustration, but are not limited to the positions, and the heater filters 77 may be arranged in a concentric fashion. Due to such a configuration, the heaters 75 are connected to the AC power source 44 through the power-feeding-part cover structures 76 and the heater filters 77. Thus, a current is supplied from the AC power source 44 to the heaters 75. Details of a heater feeding mechanism 100 that feeds power to the heaters 75 in this manner are described later. Such a configuration makes it possible to divide the stage 12 into zones by using the plurality of heaters 75 and to independently control the temperature of each of the zones. By separately controlling the temperature of each of the zones by using the plurality of heaters 75, the uniformity of the temperature of the wafer W on the stage 12 across the surface of the wafer W can be improved. The temperature control of the stage 12 can be performed based on instructions from the control part 48. The control part 48 includes a CPU, a ROM and a RAM that are not illustrated in the drawings, and controls the etching process and the temperature control process in accordance with a procedure specified by a recipe stored in the RAM and the like or data stored in a table. Here, the function of the control part 48 may be implemented by executing software or by operating hardware.

A shower head 38 is provided at a ceiling part of the chamber 10 as an upper electrode having a grounded potential. Thus, the high frequency power from the first high frequency power source 31 is capacitively supplied to the stage 12 and the shower head 38.

The shower head 38 at the ceiling part includes an electrode plate 56 with many gas discharge holes 56a and an electrode support 58 that supports the electrode plate 56 detachably. A gas supply source 62 supplies a gas from a gas introduction port 60a to the shower head 38 through a gas supply pipe 64. The gas is introduced into the chamber 10 from many of the gas discharge holes 56a. Magnets 66 annually or concentrically extending are disposed around the chamber 10, and control plasma generated in a plasma generation space between the upper electrode and the lower electrode by a magnetic force.

An exhaust passage 20 is formed between a side wall of the chamber 10 and the support 15. A circular baffle plate 22 is attached to the exhaust passage 20. An exhaust pipe 26 that forms an exhaust port 24 is provided in a bottom part of the exhaust passage 20, and the exhaust pipe 26 is connected to an exhaust device 28. The exhaust device 28 is formed of a vacuum pump such as a turbo molecular pump or a dry pump, and reduces a pressure of a process space in the chamber 10 to a predetermined degree of vacuum. A gate valve 30 for transfer that opens and closes a transfer opening for the wafer W is attached to the side wall of the chamber 10.

In the plasma processing apparatus 1 having such a configuration, when performing a process such as an etching, to begin with, a wafer W is carried into the chamber 10 from the opened gate valve 30 while the wafer W is held on a transfer arm that is not illustrated in the drawings. The wafer W is held by pusher pins that are not illustrated in the drawings above the electrostatic chuck 40, and is placed on the electrostatic chuck 40 by causing the pusher pins to move down. The gate valve 30 is closed after the wafer W is carried into the etching apparatus 1. The pressure in the chamber 10 is reduced to a setting value by the exhaust device 28. A gas is introduced into the chamber 10 from the shower head 38 in a shower form. The high frequency power of predetermined power is supplied to the stage 12. In addition, the wafer W is electrostatically attracted on the electrostatic chuck 40 by applying a voltage from the direct voltage source 42 to the electrode 40a of the electrostatic chuck 40. Plasma is generated by ionizing and dissociating an introduced gas by the high frequency power, and a process such as an etching is performed on the wafer W by action of plasma.

After the plasma etching ends, the wafer W is carried out of the chamber 10 while being held on the transfer atm. By repeating this process, the wafers W are continuously processed by using the plasma. Hereinabove, the overall configuration of the plasma processing apparatus 1 according to the present embodiment has been described.

[Heater Power Feeding Mechanism]

Figure 2A:
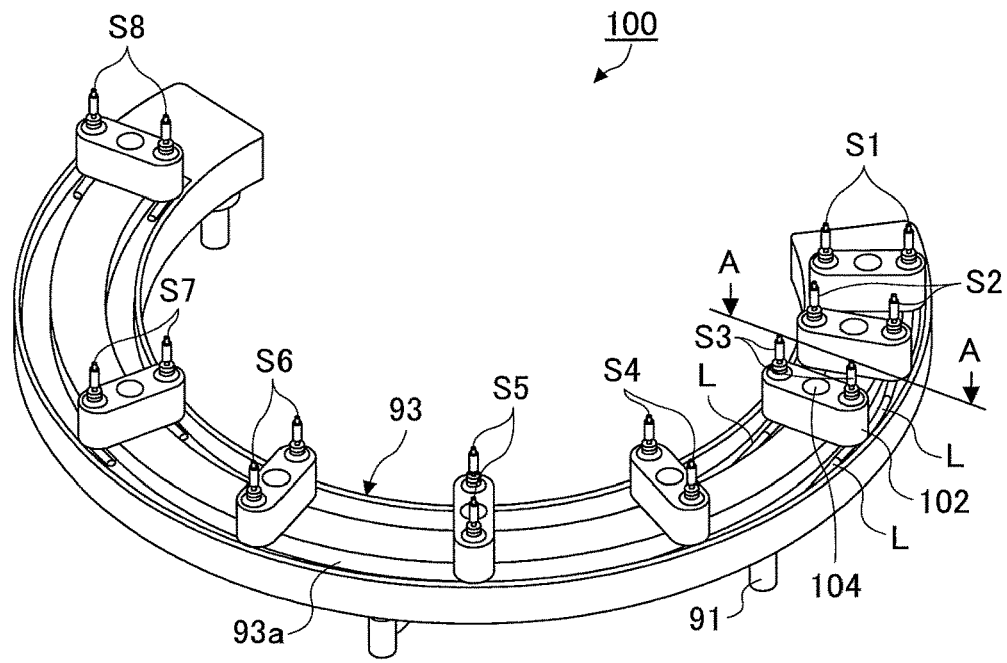
FIG. 2A is a diagram illustrating an example of a heater power feeding mechanism according to an embodiment.
Figure 2B:
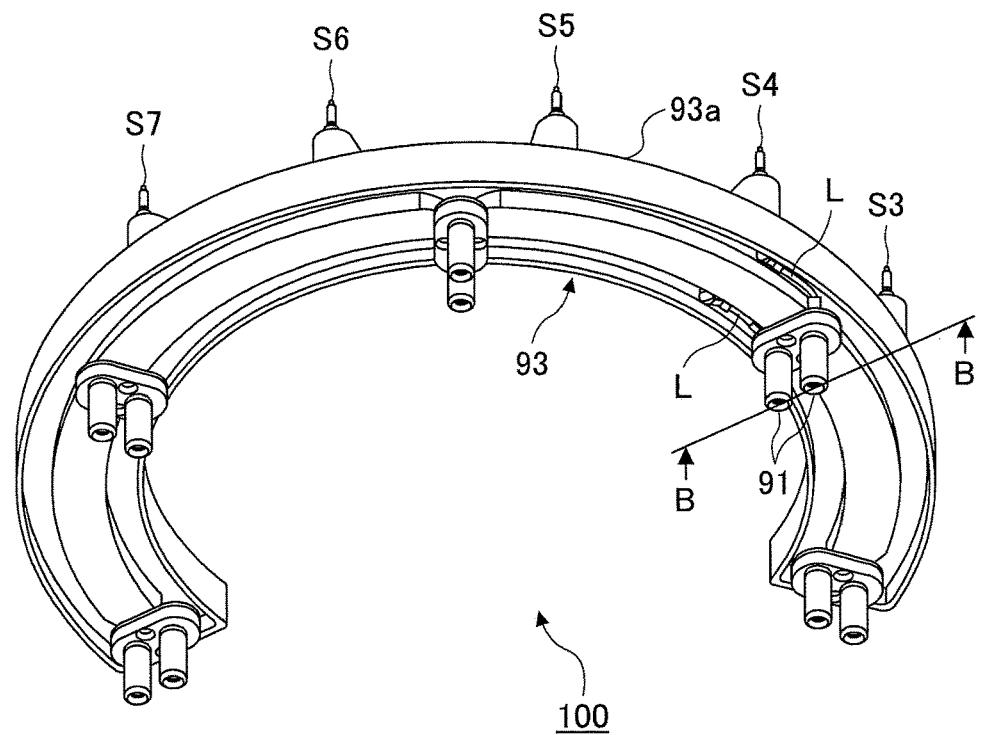
FIG. 2B is a diagram illustrating an example of a heater power feeding mechanism according to an embodiment.

Next, the configuration of the heater power feeding mechanism 100 according to the present embodiment is described below with reference to FIG. 2. FIG. 2 illustrates an example of the heater power feeding mechanism 100 according to an embodiment. FIG. 2A is a perspective view of the heater power feeding mechanism 100 as seen from the top side, and FIG. 2B is a perspective view of the heater power feeding mechanism 100 as seen from the bottom side.

The heater power feeding mechanism 100 includes an interconnection structure 93 including a plurality of sets of heater terminals S1 through S8 (which is also collectively referred to as "heater terminals S"), a plurality of heater interconnections L, and a C-shaped member 93. The plurality of pairs of heater terminals S1 through S8 is made of conductive member, and is arranged on a top portion of the C-shaped member 93a at intervals. The heater interconnections L connect at least any of the heater terminals S with each other. The C-shaped member 93a is made of resin, and is provided on the bottom surface of the holding plate 13.

As illustrated in FIG. 2A, eight sets of the heater terminals S1 through S8 are arranged on the top surface of the C-shaped member 93a by setting two terminals as one set. The top surface of the C-shaped member 93a is a first layer of the interconnection structure 93, in which desired heater terminals S are connected with each other by providing the heater interconnections L in two grooves formed in the top surface. Thus, two or more sets of the heater terminals S among eight sets of the heater terminals S1 through S8 are connected in parallel with each other by a segment unit in the top surface of the C-shaped member 93a. In FIG. 2A, the heater terminals S1 through S4 are connected with each other through the heater interconnections L.

Here, the "segment" means a minimum unit of the heater terminals needed to supply a current to a single heater 75. Moreover, the "zone" means an area controlled in a same temperature range in controlling the temperature of the stage 12 by using the plurality of heaters 75.

For example, connecting the heater terminals S1 with the heater terminals S2 by the segment unit means that one of a set (two) of the heater terminals S1 is connected to one of a set (two) of the heater terminals S2 and that the other of the set of the heater terminals S1 is connected to the other of the set of the heater terminals S2. Thus, the heater 75 connected to the set of heater terminals S1 and the heater 75 connected to the set of heater terminals S2 are controlled in a same temperature range within the same zone. In this manner, in the present embodiment, the zone configuration (the area controlled in a same temperature range as the same zone) is variably controlled by the interconnection structure 93.

Eight sets of the heater terminals S1 through S8 are provided by forming two heater terminals as one segment according to the present embodiment, but the number of the sets of the heater terminals S is not limited to this, and any number of the sets of the heater terminals S may be provided as long as the number is two or more.

Figure 3A:
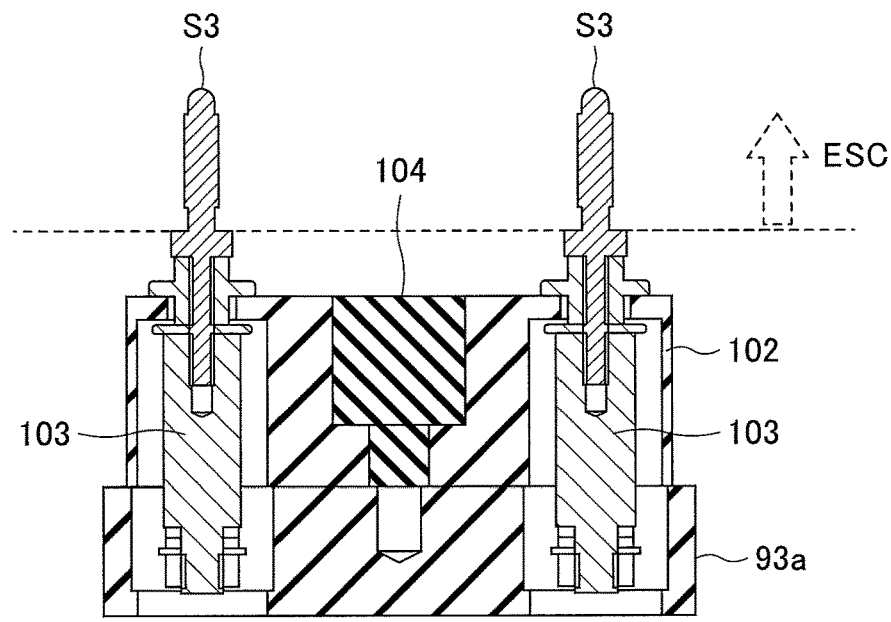
FIG. 3A is a diagram illustrating an example of a heater terminal and a power-feeding-part cover structure according to an embodiment.

FIG. 3A is an A-A section of FIG. 2A, and illustrates a cross section of the heater terminals S3 of one segment and its neighborhood. Two of the heater terminals S3 is engaged with jack terminals 103, and is fitted in a fixing case 102 made of an insulating material. The fixing case 102 is fixed to the C-shaped member 93a by a screw 104. Upper portions of two of the heater terminals S3 penetrate through the fixing case 102, are exposed above the fixing case 102, and are connected to the heaters 75 embedded in the electrostatic chuck (ESC) 40 through the holding plate 13.

As illustrated in FIG. 2B, a plurality of sets of power-feeding-part cover 91 is provided on the bottom surface of the C-shaped member 93a at intervals. The bottom surface of the C-shaped member 93a is a second layer of the interconnection structure 93, and includes the heater interconnections 1 in two grooves formed in bottom surface. The heater interconnections L connect any end of the heater terminals S penetrating through the C-shaped member 93a arranged on the top surface with any of the power-feeding-part covers 91 by the segment unit. Thus, the heater terminals S1 through S4 are connected to the power-feeding-part cover 91 through the heater interconnections L provided in the first layer and the second layer of the interconnection structure.

In FIG. 2A, although the heater terminals S1 through S4 are connected by the heater interconnections L, in the connection between the heater terminals S by the heater interconnections L, at least any of eight sets of the heater terminals S1 through S8 just has to be connected with each other. Thus, two sets or more of the heater terminals S of eight sets of the heater terminals S1 through S8 are connected in parallel with each other by the segment unit in the top surface of the C-shaped member 93a.

In the interconnection structure 93 according to the present embodiment, a set of heater terminals S is connected to one heater 75 or the plurality of heaters 75. Hence, when the plurality sets of heater terminals S are connected to each other through the heater interconnections L, all of the heaters 75 connected to each other through the plurality sets of heater terminals S constitute the same zone controlled in the same temperature range. In other words, whether or not the heater interconnections L connect the heater terminals with each other by the segment unit changes the heaters 75 connected in parallel with each other, and changes the configuration of the same zone controlled in the same temperature range. Hence, according to the interconnection structure 93 of the present embodiment, by connecting eight sets of the heater terminals S1 through S8 with each other through the heater interconnections L by the segment unit, the zone configuration of the stage 12 can be variably controlled.

Figure 3B:
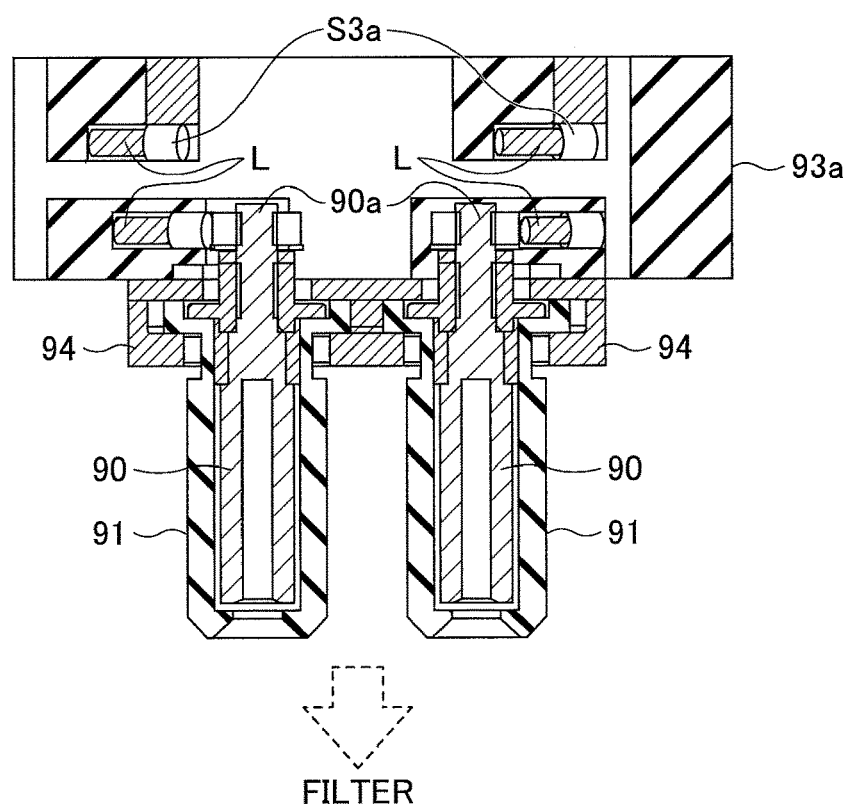
FIG. 3B is a diagram illustrating an example of a heater terminal and a power-feeding-part cover structure according to an embodiment.

FIG. 3B is a B-B cross section of FIG. 2B, and illustrates a cross section of two sockets 90 and the power-feeding-part cover members 91, and a part of the heater interconnections L. The power-feeding-part covers 91 are supported by fixing members 94 on the bottom surface of the C-shaped member 93c. The sockets 90 are made of conductive members, and the power-feeding-part covers 91 are made of insulating members. The power-feeding-part covers 91 cover the sockets 90.

FIG. 4 illustrates a detail of the interconnection structure 93 of the heater power feeding mechanism 100 according to the present embodiment. The heater terminals S1 through S4 are connected with each other through the heater interconnections L in the first layer illustrated in FIG. 4 by utilizing a space under the holding plate 13 of FIG. 1, and the heater terminal S4 is connected to the heater filters 77 through the heater interconnections L in the second layer. FIG. 3B illustrates a part of the heater interconnections L that connect lower end portions S3a of two of the heater terminals S3 with upper end portions 90a of the sockets 90. Plugs 76 of the heater filters 77 illustrated in FIG. 1 are inserted into the sockets 90.

Thus, the heaters 75 on the side of the heater terminal S (the first layer side) are connected to the heater filters 77 on the socket side (the second layer side) through the heater interconnections L, and a power feeding line causing a current from the AC power source 44 to flow to the heaters 75 is formed.

In a planar view of the C-shaped member 93a illustrated in FIG. 4, the heater interconnections L connect the heater terminals S1 to S2, the heater terminals S2 to S3, and the heater terminals S3 to S4 by the segment unit.

Figure 4A:
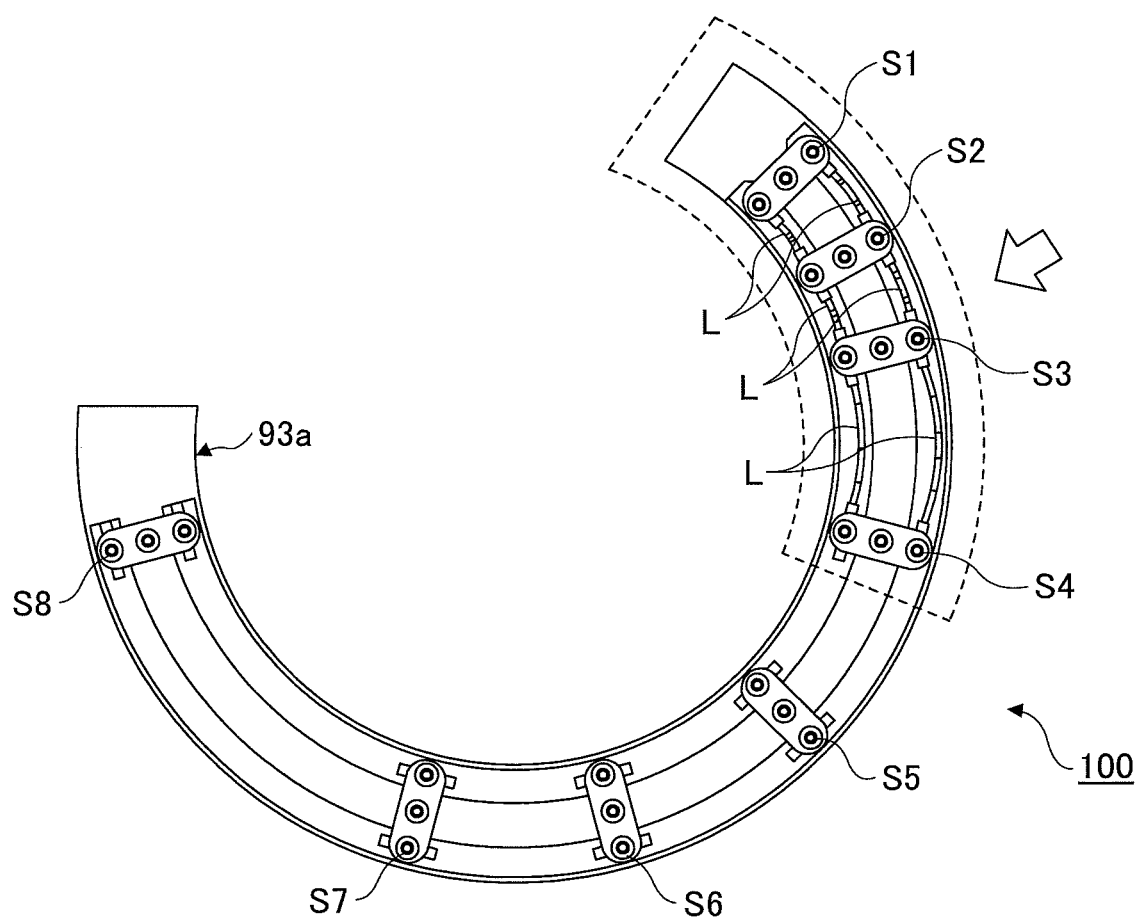
FIG. 4A illustrates a detail of an interconnection structure of a heater power feeding mechanism according to an embodiment.
Figure 4B:
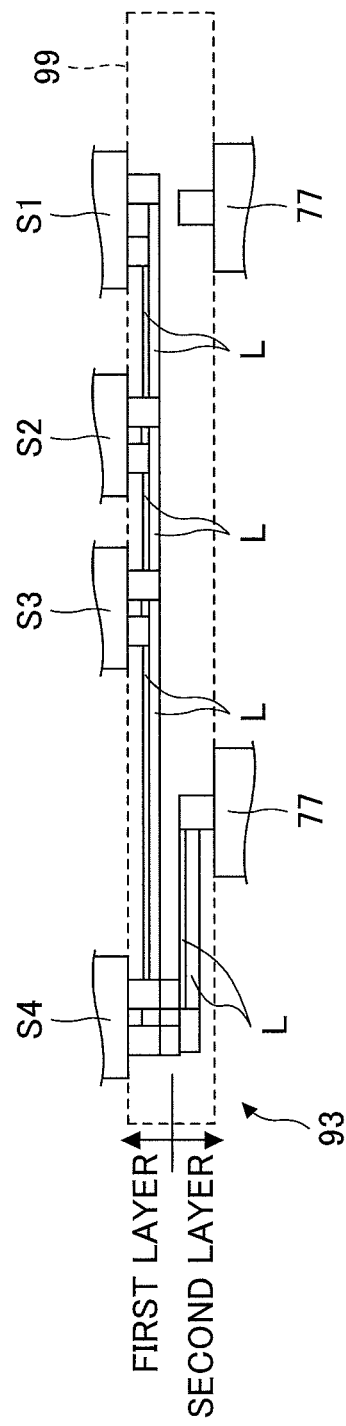
FIG. 4B illustrates a detail of an interconnection structure of a heater power feeding mechanism according to an embodiment.

FIG. 4B is a lateral view of the interconnection structure 93 corresponding to the C-shaped member 93a surrounded by a dashed line illustrated in FIG. 4A. The interconnection structure 93 is a connecting structure between the heater terminals S using the heater interconnections L in the space under the holding plate 13. The interconnection structure 93 may be covered with a case 99.

The interconnection structure 93 is a double structure, and as discussed above, in the first layer, the heater interconnections L are configured to connect at least any of the plurality sets of the heater terminals S with each other by the segment unit. In the example illustrated in FIG. 4B, in the first layer, the heater interconnections L connect the heater terminals S1 through S4 with each other by the segment unit. In the second layer, the heater interconnections L connect the heater terminals S to the filters 77. In the example illustrate in FIG. 4B, in the second layer, the heater interconnections L connect the heater terminal S4 to the heater filters 77 close to the heater terminal S4. Thus, the current from the AC power source 44 is supplied to the plurality of heaters 75 connected to the heater terminals S1, S2, S3 and S4, respectively. The zone whose temperature is controlled by the plurality of heaters 75 (see FIG. 1) connected in parallel with each other through the heater interconnections L forms the same zone. From such a configuration, according to the heater power feeding mechanism 100 of the present embodiment, by connecting at least any of eight sets of the heater terminals S1 through S8 with each other by the segment unit, the configuration of the zone to be controlled to the same temperature in the stage 12 can be variably controlled.

Here, in the above embodiment, in the interconnection structure 93, at least any of eight sets of the heater terminals S provided in the C-shaped member 93a at intervals are connected with each other by using the heater interconnections L. However, the member in which the heater terminals S are provided is not limited to the C-shaped member 93a, but may be a member, for example, formed into a circular shape, a circular shape partially having an opening or a fan-like shape. In this case, the circular shape may be an ellipse or an exact circle.

[Adjustment of Zone Configuration]

Next, adjustment of the zone configuration according to the present embodiment is described below with reference to FIG. 5. FIG. 5 illustrates an example of the adjustment of the zone configuration according to an embodiment. FIG. 5A illustrates an example of the zone configuration when the plasma processing apparatus 1 is the capacitively coupled plasma (CCP (Capacitively Coupled Plasma)) apparatus of FIG. 1. FIG. 5B illustrates an example of the zone configuration when the plasma processing apparatus 1 is a CVD (Chemical Vapor Deposition) apparatus using a radial line slot antenna.

The distribution of plasma generated in the chamber 10 changes depending on the properties of the plasma processing apparatus 1, the process conditions and the like. Hence, in the heater power feeding mechanism 100, the zone configuration is adjusted to the distribution of plasma to be generated, by changing the connection of the heater interconnections L in the interconnection structure 93.

For example, in the case of CCP apparatus, the distribution of plasma is uniform inside the stage, and is likely to be non-uniform outside the stage. In this case, the zone configuration (arrangement of each of the zones) is controlled so as to broaden the inside zone and to narrow the outside zone.

More specifically, as illustrated in FIG. 5 "a-1", the heater interconnections L connect the heater terminals S5 with S6. The heater filter 77b in FIG. 5 "a-3" is connected to the power feeding covers 91 shown by circles of "Middle" in FIG. 5 "a-2." Thus, the heater terminals S5 and S6 are connected to the heater filter 77b, and the plurality of heaters 75 connected to the heater terminals S5 and S6 are controlled in the same temperature range.

The heater filter 77c in FIG. 5 "a-3" is connected to the power-feeding-part covers shown by a circle of "Edge" in FIG. 5 "a-2." Thus, the heater terminal S7 is connected to the heater filter 77c. With respect to the heater terminal S8, the heater filter 77d in FIG. 5 "a-3" is connected to the power-feeding-part covers 91 shown by a circle of "Very Edge" (V. Edge) in FIG. 5 "a-2." Thus, the heater terminal S8 is connected to the heater filter 77d.

In this manner, the very edge (the outermost zone) and the edge zone are made narrower than the middle zone.

In contrast, as illustrated in FIG. 5 "a-1", the heater interconnections L connect the heater terminals S1 through S4 with each other. The heater filter 77a in FIG. 5 "a-3" is connected to the power-feeding-part cover shown by a circle of the center (Center) in FIG. 5 "a-2." Thus, the plurality of heaters 75 connected to the heater terminals S1 through S4 is controlled in the same temperature range.

In this manner, in the case of CCP apparatus of FIG. 5A, the zone configuration can be controlled so as to make the center zone on the inner circumference broad, the edge zone on the outer circumference and the very edge zone narrow, and the middle zone broader than the edge zone and the very edge zone. Thus, the uniformity of the temperature of the stage 12 can be improved. Here, when a heater is arranged at the focus ring 18, the heater filter 77e is connected to the heater at the focus ring (F/R) 18.

In the case of CVD apparatus using the radial line slot antenna of FIG. 5B, the distribution of plasma is uniform outside the stage 12, and is likely to be non-uniform inside the stage 12. In this case, the zone configuration is preferred to be variably controlled so as to broaden the outside zone and to narrow the inside zone.

Accordingly, in this case, as illustrated in FIG. 5 "b-1", the heater interconnections L connect the heater terminals S7 with the S8. Moreover, the heater interconnections L connect the heater terminals S5 with S6. Thus, the plurality of heaters 75 connected to the heater terminals S7 and S8 (corresponding to the very edge zone) are controlled in the same temperature range, and the plurality of heaters 75 connected to the heater terminals S5 and S6 (corresponding to the edge zone) are controlled in the same temperature range.

Furthermore, the heater interconnections L connect the heater terminals S2 through S4 with each other. Thus, the plurality of heaters 75 connected to the heater terminals S2 through S4 (corresponding to the middle zone) are controlled in the same temperature range. Here, no heater terminal is connected inn parallel with the heater terminal S1, and the heater 75 connected to the heater terminal S1 corresponds to the center zone.

In this manner, in the case of CVD apparatus using the radial line slot antenna of FIG. 5B, the zone configuration can be controlled so as to have a narrow center zone on the inner circumference side and broad zones from the middle zone to the very edge zone. Thus, the uniformity of temperature of the stage 12 can be improved.

Here, because the connection to the heater filters 77 illustrated in FIG. 5 "b-2" and FIG. 5 "b-3" is similar to the connection to the heater filters 77 illustrated in FIG. 5 "a-2" and FIG. 5 "a-3", the description is omitted.

[Method for Controlling Temperature of Stage]

Next, a method for controlling temperature of a stage according to the present embodiment is described below with reference to FIGS. 6 and 7. FIG. 6 is a flowchart illustrating an example of the method for controlling the temperature of the stage according to an embodiment. FIG. 7 is a table illustrating an example of a zone configuration for each apparatus according to an embodiment. For example, as described at FIG. 5A, when the plasma processing apparatus 1 is the CCP apparatus, with respect to the heater terminals S connected in parallel with each other, the table preliminarily specifies that the center zone includes the heater terminals S1 through S4 and that the middle zone includes the heater terminals S5 and S6. Here, no heater terminal is connected in parallel with the heater terminals S7 of the edge zone and the heater terminals S8 of the very edge zone.

In FIG. 7, the zone configurations are illustrated by citing an example of three plasma processing apparatuses, but in another plasma processing apparatus, a zone configuration depending on the properties of the distribution of plasma of the apparatus can be determined, and can be stored in the table. Furthermore, the type (properties) of the plasma processing apparatus 1 is an example of conditions in which the wafer is processed by using the plasma. Process conditions (a gas type, a gas flow rate, a temperature, a pressure, a power of high frequency power and the like) are cited as other examples of conditions in which the wafer is processed by using the plasma. The adjusted zone configuration depending on the "conditions in which the wafer is subject to the plasma process" cited as these examples are preliminarily stored in the table, and the zone configuration is variably controlled as illustrated in the flowchart of FIG. 6 based on the table. The table is stored in the memory part such as the RAM.

When the process of FIG. 6 is started, the control part 48 determines whether or not the plasma processing apparatus 1 is being assembled or maintained (step S10). When the plasma processing apparatus 1 is being assembled or maintained, the control part 48 determines connection locations among the heater terminals S to form a zone configuration depending on the apparatus (step S12). The control part 48 controls the connection so as to connect the heater terminals S with each other by using the heater interconnections L by the segment unit (step S14).

By providing a switch mechanism in the heater interconnections L connecting the heater terminals S with each other, the connection between the heater terminals S using the heater interconnections L is preferably performed automatically by turning on and off the switch.

As discussed above, according to the heater power feeding mechanism 100 of the present embodiment, the same stage 12 can be controlled so as to have different zone configurations by changing the connection of the heater interconnections L in the interconnection structure 93. For example, when two heaters 75 connected between the heater terminals S are arranged in a circumferential direction, according to the present embodiment, the zone width can be variably controlled in the circumferential direction by controlling the connection between the heater terminals S. In other words, the zone configuration can be controlled in the circumferential direction.

In contrast, when two heaters 75 connected between the heater terminals S are arranged in a radial direction, according to the present embodiment, the zone width can be variably controlled in the radial direction by controlling the connection between the heater terminals S. In other words, the zone configuration can be controlled in the radial direction.

As discussed above, although the description of the embodiments of the heater power feeding mechanism and the method for controlling the temperature of the stage has been given, the heater power feeding mechanism and the method for controlling the temperature of the stage of the present invention is not limited to the above embodiments, but various modifications and improvements can be made without departing from the scope of the invention. Moreover, the embodiments and modifications can be combined as long as they are not contradictory to each other.

For example, the heater power feeding mechanism of the present invention can be applied not only to the capacitively coupled plasma (CCP: Capacitively Coupled Plasma) apparatus, but also to other plasma processing apparatuses. The other plasma processing apparatuses may be an inductively coupled plasma (ICP: Inductively Coupled Plasma) apparatus, a CVD (Chemical Vapor Deposition) apparatus using a radial line slot antenna, a helicon wave excited plasma (HWP: Helicon Wave Plasma) apparatus, an electron cyclotron resonance plasma (ECR: Electron Cyclotron Resonance Plasma) apparatus and the like.

A substrate to be processed by the plasma processing apparatus of the present invention is not limited to the wafer, but for example, may be a large substrate for a flat panel display, a substrate for an EL (electroluminescence) device or a solar cell.

The present application is based on and claims the benefit of priority of Japanese Patent Application No. 2014-098569 filed on May 12, 2014, the entire contents of which are herein incorporated by reference.

DESCRIPTION OF THE REFERENCE NUMERALS 1 plasma processing apparatus
10 chamber
12 stage
13 holding plate
28 exhaust device
38 shower head
40 electrostatic chuck
44 AC power source
75 heater
77 heater filter
91 power-feeding-part cover
93 interconnection mechanism 93a C-shaped member
100 heater power feeding mechanism
S1-S8 heater terminal
L heater interconnection

The invention claimed is:

1. A method for controlling a temperature of a stage by dividing a stage on which a substrate is placed into zones with a plurality of heaters and using a heater power feeding mechanism capable of controlling a temperature for each zone, the heater power feeding mechanism including a plurality sets of heater terminals connected to any of the plurality of heaters, each of the plurality of sets of heater terminals being connected to one or more of the plurality of heaters, the method comprising:
   a step of determining connection locations between the plurality of sets of the heater terminals for connecting a group of the plurality of sets of heater terminals in parallel with each other to connect the plurality of heaters in parallel with each other; and
   a step of controlling a zone configuration of the stage by connecting the determined connection locations between the plurality sets of the heater terminals in parallel with each other using a heater interconnection, thereby forming a temperature zone composed of the plurality of heaters connected in parallel with each other,
   wherein the step of determining the connection locations comprises determining the connection locations between the plurality sets of the heater terminals based on the zone configuration depending on a condition in which the substrate is processed by using plasma, and
   wherein the step of controlling the zone configuration comprises variably controlling the zone configuration of the stage by changing the determined connection locations between the plurality sets of the heater terminals using the heater interconnection.

2. A method for controlling a temperature of a stage by dividing a stage on which a substrate is placed into zones with a plurality of heaters and using a heater power feeding mechanism capable of controlling a temperature for each zone, the heater power feeding mechanism containing a plurality of groups of heater terminals, each of the groups including a plurality of sets of heater terminals connected to any of the plurality of heaters, the method comprising steps of:
   determining connection locations between the plurality of sets of the heater terminals;
   controlling a zone configuration of the stage by connecting the determined connection locations between the plurality sets of the heater terminals by being divided into the plurality of groups using a heater interconnection; and
   connecting at least any of the plurality of heater terminals with a filter using the heater interconnection,
   wherein the step of determining the connection locations comprises determining the connection locations between the plurality sets of the heater terminals based on the zone configuration depending on a condition in which the substrate is processed using plasma, stored in a memory part in advance, and
   wherein the step of controlling the zone configuration comprises variably controlling the zone configuration of the stage by changing the determined connection locations between the plurality sets of the heater terminals by being divided into the groups using the heater interconnection.

* * * * *